United States Patent
Cheng et al.

(10) Patent No.: US 7,651,732 B2
(45) Date of Patent: Jan. 26, 2010

(54) MAGNESIUM-TITANIUM SOLID SOLUTION ALLOYS

(75) Inventors: Yang T. Cheng, Troy, MI (US); Mark W. Verbrugge, Troy, MI (US); Michael P. Balogh, Novi, MI (US); Daniel E. Rodak, Southfield, MI (US); Michael Lukitsch, Marysville, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 0 days.

(21) Appl. No.: 11/851,594

(22) Filed: Sep. 7, 2007

(65) Prior Publication Data

US 2009/0068357 A1 Mar. 12, 2009

(51) Int. Cl.
C23C 16/00 (2006.01)
C23C 16/06 (2006.01)
C23C 14/30 (2006.01)

(52) U.S. Cl. ............ 427/250; 427/255.29; 427/255.32; 427/595; 427/596; 427/597

(58) Field of Classification Search ............ 427/248.1, 427/250, 255.23, 255.28, 255.36, 255.395
See application file for complete search history.

(56) References Cited

U.S. PATENT DOCUMENTS

| 4,386,115 | A | * | 5/1983 | Krevet et al. | 427/62 |
| 4,943,450 | A | | 7/1990 | Sarin | |
| 4,980,203 | A | * | 12/1990 | Dabosi et al. | 427/252 |
| 5,421,917 | A | * | 6/1995 | Partridge et al. | 148/407 |
| 6,599,466 | B1 | * | 7/2003 | Moxson et al. | 419/27 |

FOREIGN PATENT DOCUMENTS

| GB | 2262539 | * 12/1991 |
| JP | 2003286563 | 10/2003 |
| KR | 1020010109581 | 12/2001 |
| KR | 1020050082786 | 8/2005 |
| WO | WO 8910425 | 11/1989 |

OTHER PUBLICATIONS

Written Opinion of the International Searching Authority for application No. PCT/US2008/074977 dated Apr. 6, 2009.
International Search Report for application No. PCT/US2008/074977 dated Apr. 6, 2009.

* cited by examiner

Primary Examiner—Timothy M Speer
Assistant Examiner—Gordon R Baldwin
(74) Attorney, Agent, or Firm—Reising Ethington P.C.

(57) ABSTRACT

Films of magnesium mixed with titanium are produced by non-equilibrium alloying processes such as electron beam evaporation of magnesium and titanium ingots in a very low pressure chamber. Such magnesium-titanium films form as single phase solid solutions. Titanium is inherently resistant to corrosion and its admixture with magnesium in solid solution provides a new composition that is less subject to intra-film galvanic corrosion. The magnesium-titanium films also provide relatively hard and strong coatings.

5 Claims, 2 Drawing Sheets

MAGNESIUM-TITANIUM SOLID SOLUTION ALLOYS

TECHNICAL FIELD

This disclosure pertains to the combining of magnesium and titanium under non-equilibrium conditions to form a solid solution of titanium in magnesium. More specifically, this disclosure pertains to formation, such as by vapor deposition, of films of solid solutions of titanium in magnesium on a substrate, for example a magnesium alloy substrate. The films offer high elastic modulus and hardness and may have high corrosion resistance.

BACKGROUND

Magnesium and titanium have positive heats of mixing. As a result they have not been found to form intermetallic compounds and they have very little mutual solubility. Equilibrium phase diagrams for the magnesium-titanium system are prepared using mixtures of predetermined compositions of magnesium and titanium from close to 100 percent magnesium to nearly 100 percent titanium. Each of several known-composition mixtures is examined at a range of temperatures at which all constituents are liquid and at a lower range of temperatures in which the constituents are wholly solid. At each temperature the mixture is allowed to attain an equilibrium state. The presence of one or more equilibrium phases at each temperature is observed and the composition of each phase is analyzed. As stated, mixtures of magnesium and titanium display little mutual solubility under such equilibrium conditions and no intermetallic compounds. However, titanium is a corrosion resistant material and there is interest in incorporating titanium in magnesium as a solid solution to increase the corrosion resistance of the resulting alloy and to obtain mechanical properties that result from a single-phase combination of these elements.

This disclosure provides solid solutions of titanium in magnesium by processes in which the titanium and magnesium do not reach an equilibrium condition as is obtained in processing which yields equilibrium phase products.

SUMMARY

In accordance with an embodiment of the invention, target anodes of magnesium and titanium, situated in a vacuum chamber, are bombarded with separate electron beams to produce a vapor of magnesium and titanium atoms for co-deposition as a solid film on a substrate. The substrate may be at about room temperature and may be suitably cleaned or otherwise prepared to receive an adherent coating of the elements as they are deposited from the vapor mixture. By controlling the relative evaporation rates of the metals, magnesium-based films with desired titanium content may be formed. Film thicknesses of several nanometers up to a millimeter or more may be obtained depending on the requirements of the non-equilibrium, solid solution magnesium-titanium coating.

Many different substrate materials may benefit from a single phase magnesium-titanium coating film. In many applications, the magnesium-titanium coatings may find particular utility on magnesium or magnesium alloy substrates. The substrate may be the surface of an article that has, for example, been made by a casting process, a molding process, or other material working process, and the coating is thus applied to a chemically similar substrate to provide useful surface properties.

Significant amounts of titanium may be incorporated into a magnesium lattice to form a solid solution characterized by the empirical formula $Mg(1-x)Ti(x)$, where x represents the atomic fraction of titanium in the mixture. The composition of a co-deposited film may be analyzed by electron probe analysis. X-ray diffraction analysis of deposited films indicated that solid solutions of titanium in magnesium were made by vapor deposition substantially across the full range of magnesium and titanium mixtures. X ray diffraction also indicated that titanium atoms were incorporated with magnesium atoms in a hexagonal close packed crystal structure.

Magnesium-titanium solid solution films may be used, for example, as coatings on substrates of commercial magnesium alloys or on other metal or non-metal substrates. Nanometer scale indentation tests on magnesium-titanium solid solution films deposited on silicon yield hardness and Young's modulus values for the films. These test results indicate the elastic modulus and yield strength (based on hardness values) is significantly higher than corresponding properties of conventional magnesium alloys. Moreover, the single phase solid solution microstructure of the film is not expected to form corrosive galvanic couples within the film. In applications where single phase magnesium-titanium coatings are deposited on magnesium alloys, it may be preferred to use coatings containing up to about twenty atomic percent titanium, $Mg(1-x)Ti(x)$ where x is greater than 0 and no greater than about 0.2.

Other objects and advantages of the invention will be apparent from a detailed description of preferred embodiments which follows.

DESCRIPTION OF PREFERRED EMBODIMENTS

In accordance with an embodiment of this invention, a solid solution of magnesium and titanium composition is deposited as a film on a substrate. The film has utility as a coating on bulk materials such as a substrate of a conventional magnesium alloy. In the case of a magnesium or magnesium alloy substrate it may be preferred to apply films containing titanium in an amount up to about twenty atomic percent of the Mg—Ti mixture. Titanium additions in this range may be selected to enhance desirable corrosion resistance and/or mechanical properties of the magnesium-based coating on a magnesium-based alloy substrate.

The solid solution films of this invention have a hexagonal close packed crystal structure that provides a relatively hard and strong film. Moreover, the titanium content in a single magnesium-titanium phase offers protection from corrosion due intra-film galvanic action.

Solid solution films of this invention may be prepared by non-equilibrium vapor deposition methods that yield a single phase magnesium-titanium alloy product. One such non-equilibrium process for the synthesis of a solid solution Mg—Ti film is by electron beam evaporation of magnesium and titanium from separate ingots with deposition of the magnesium-titanium vapor on a desired substrate surface. Virtually any solid material may be used as a substrate. Solid solution magnesium-titanium films may have utility as strong and corrosion resistant coatings on magnesium or magnesium alloy substrates where the thickness of the deposited coating is determined by an assessment of its function as a coating on the particular substrate.

Figure 1:
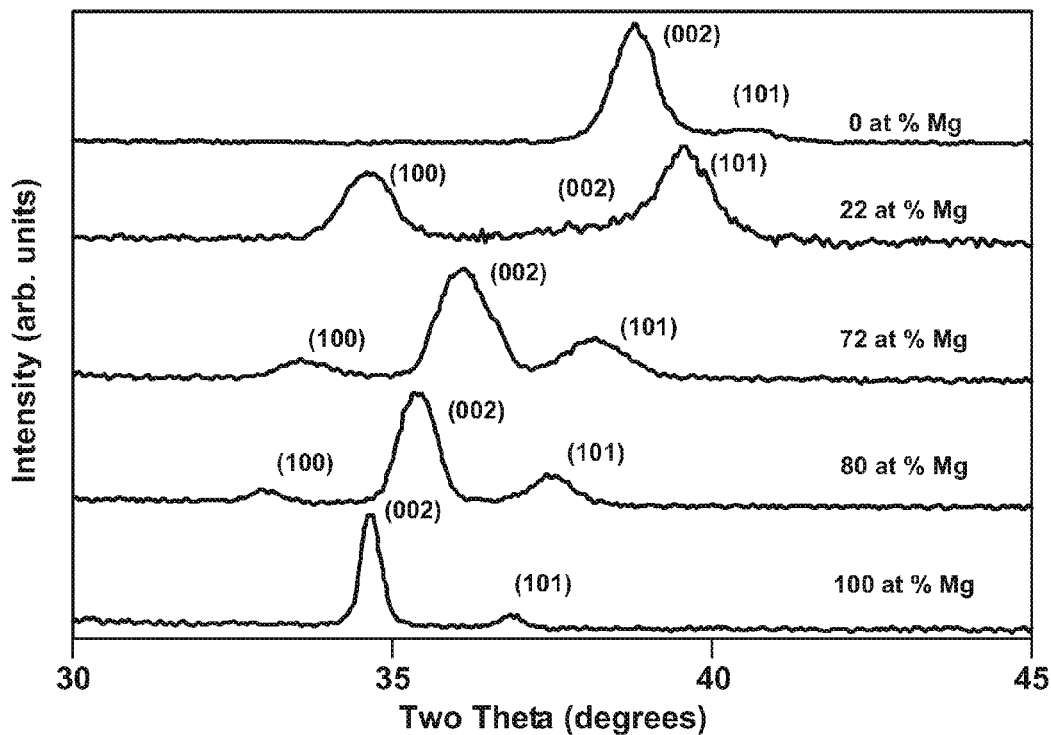
FIG. 1 presents X-ray diffraction patterns, over a range of 30 to 45 degrees two theta, of pure magnesium, pure titanium, and three co-deposited $Mg(1-x)Ti(x)$ specimens.

FIG. 1 presents five overlying X-ray diffraction patterns (intensity in arbitrary units vs. diffraction angle in 2 theta degrees) for 100% magnesium (lowest pattern, x=0), 100% titanium (uppermost pattern, x=1) and three co-deposited magnesium and titanium films containing 80 atomic percent magnesium, 72 atomic percent magnesium and 22 atomic percent magnesium, respectively, presented as successively higher patterns over the magnesium pattern.

Pure magnesium and pure titanium are known to each crystallize in a hexagonally close packed lattice structure (hcp). The (002) and (101) diffraction peaks are characteristic of these elements. Of course, the (002) and (101) peaks of magnesium are seen at different diffraction angles from the corresponding peaks for titanium. FIG. 1 shows that the (002) and (101) X-ray diffraction peaks shifted systematically when Ti atoms are incorporated into the lattice of hcp-Mg. Each of these diffraction patterns is consistent with a single phase and generally continuous hcp lattice variation with composition.

Figure 2:
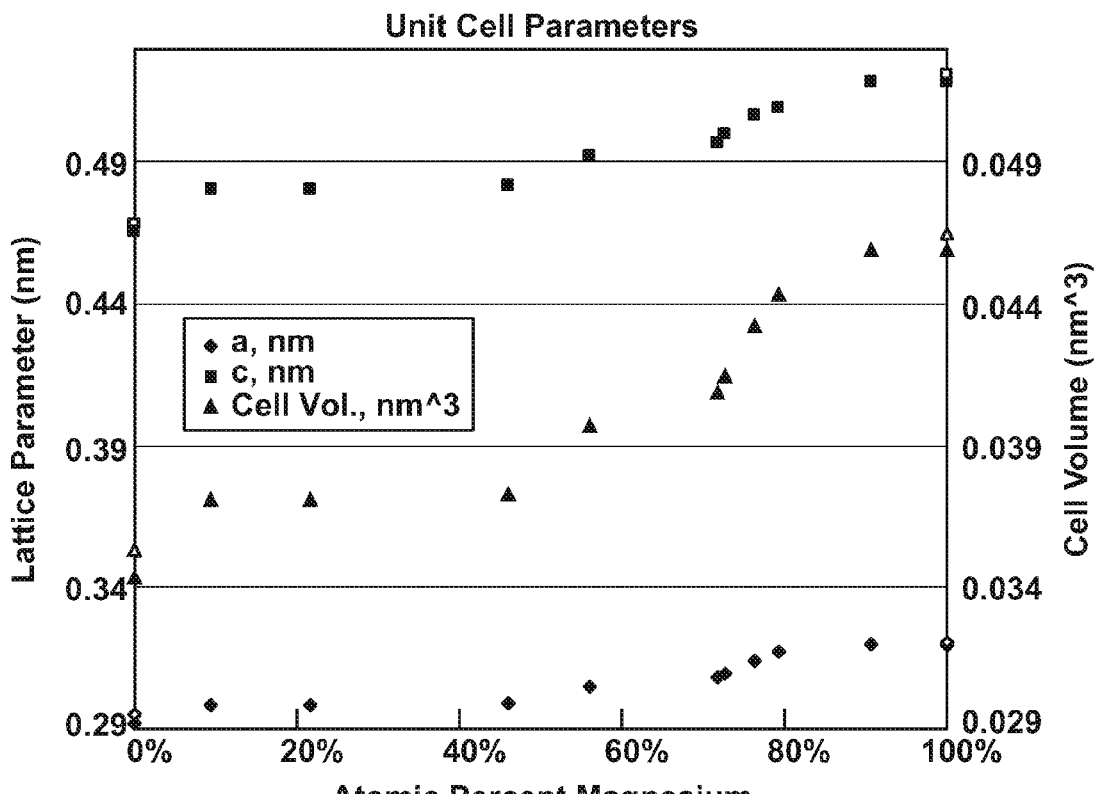
FIG. 2 is a graph of unit cell lattice parameters, left vertical axis, with cell parameter a (filled diamonds) and cell parameter c (filled squares), each in nm, and cell volume, right vertical axis, in $nm^3$, vs. atomic percent magnesium. Open symbols are reference values.

The a and c unit cell parameters in nanometers for the microstructures of the respective films may be calculated from the X-ray diffraction data, and cell volume (in cubic nanometers) may be calculated from the cell parameters. The changes in lattice parameter values and cell volume have been calculated and displayed in FIG. 2.

Figure 3:
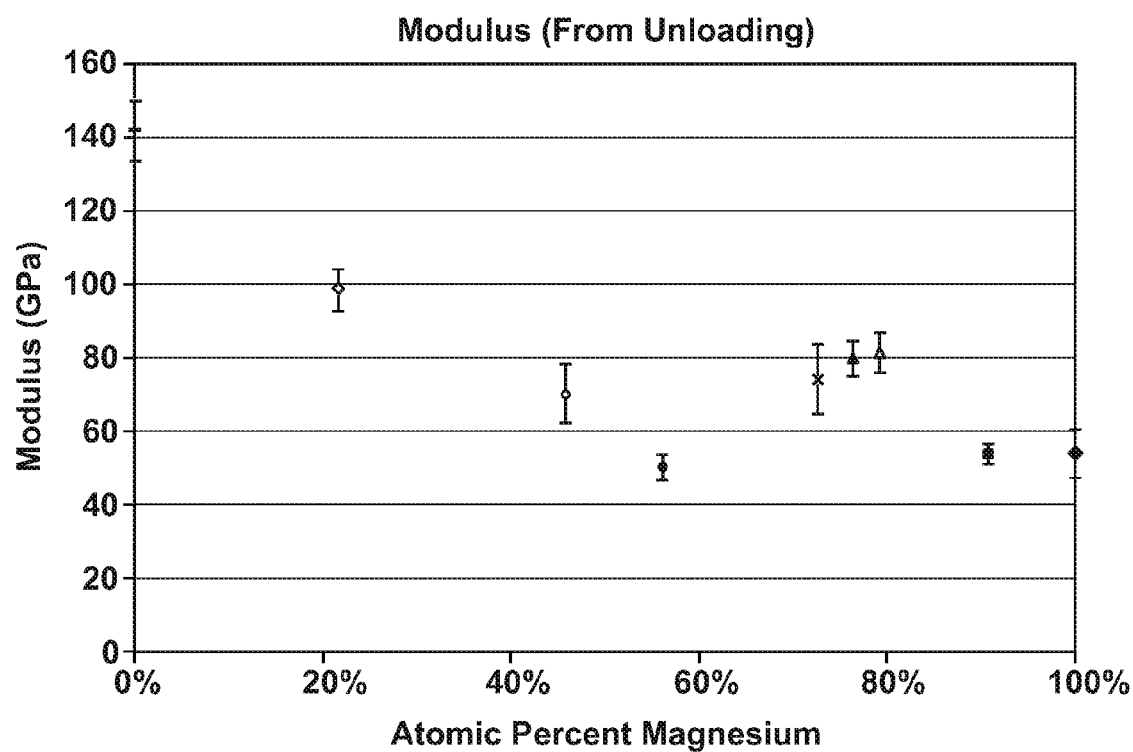
FIG. 3 is a graph of elastic modulus (GPa) vs. atomic percent magnesium for pure magnesium, pure titanium, and several solid solutions of $Mg(1-x)Ti(x)$.
Figure 4:
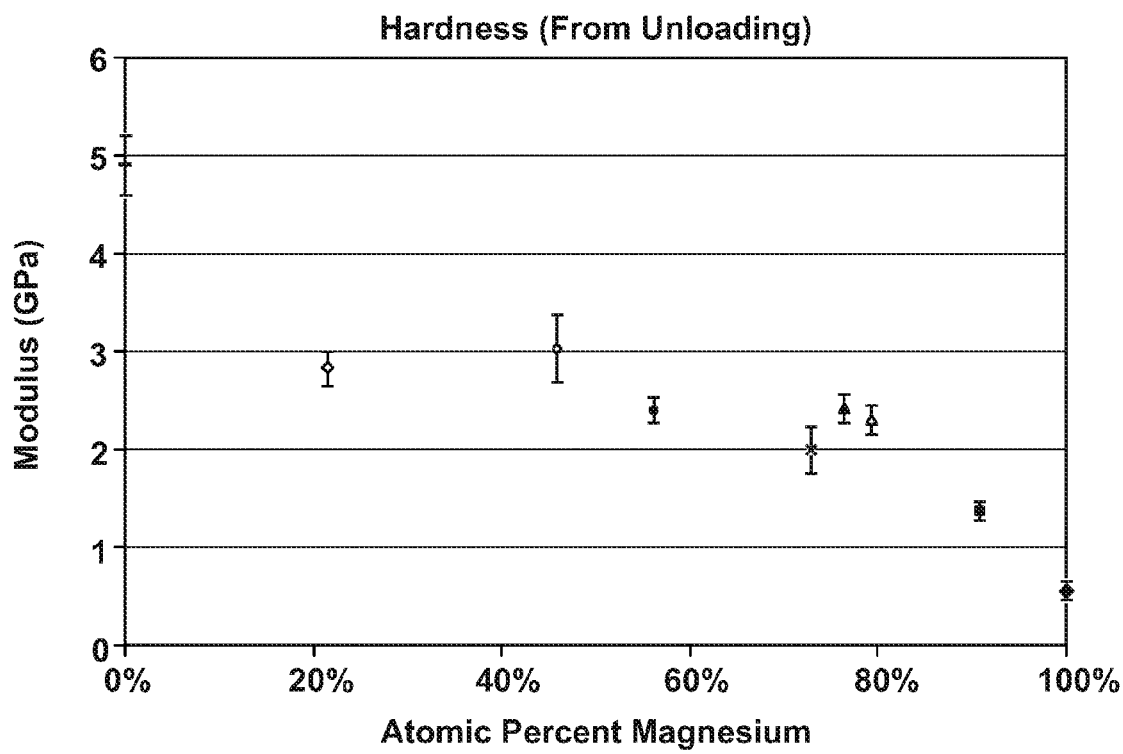
FIG. 4 is a graph of hardness (GPa) vs. atomic percent magnesium for pure magnesium, pure titanium and several solid solutions of $Mg(1-x)Ti(x)$.

Nanometer scale indentation was used to obtain the elastic modulus and hardness of pure Mg, pure Ti, and several co-deposited Mg(1−x)Ti(x) specimens. The measurement results are summarized in FIGS. 3 and 4 for the elastic modulus and hardness, respectively. These results show that both the elastic modulus and yield strength (which is about ⅓ of the hardness value) of the solid solution Mg(1−x)Ti(x) are significantly higher than that of conventional Mg alloys.

EXPERIMENTAL DETAILS

Sample Preparation

Magnesium-titanium films were deposited using an electron beam vapor deposition system. The deposition was performed at a chamber pressure on the order of $1.0 \times 10^{-8}$ Torr at a substrate temperature of about 25° C. The magnesium and titanium source materials used were 99% pure chunk and 99.8% pure granules, respectively. The magnesium and titanium source materials were located in two separate electron beam evaporation sources. The rates of evaporation were controlled by respective electron beams. The rates of deposition were monitored by two Inficon deposition controllers to produce a two component coating of desired composition. The thickness of the coating is a function of the rate and duration of deposition. In the following experiments coatings were produced having thicknesses in the range of about 100 nanometers.

Silicon substrates were used in these experiments for purposes of demonstrating the deposition of the solid solution of magnesium-titanium material and for analyzing the films.

The films were subjected to electron probe microanalysis after creation to determine and confirm the desired composition.

A three-by-three array of 50 nm depth controlled indentations were performed at a targeted strain rate of 0.05 (I/s) using a MTS nano-instruments Dynamic Contact Module (DCM) nanometer scale indenter equipped with a Berkovich indenter. Hardness and Young's modulus values of each indent were calculated by the Oliver-Pharr method assuming a Poisson ratio of 0.3 and reported as an average value of the nine indents for each of the alloys.

XRD data were collected using a Bruker GADDS diffractometer using copper k-alpha radiation, a 0.5 mm collimator, a 15 cm sample-to-detector distance, and a 10 degree incidence angle. Data were collected from 10-89 degrees two theta with a 5 minute integration time. Lattice parameters were manually fitted until the difference between the observed and calculated diffraction peak position was minimized.

Thus, a vapor deposition process, such as electron beam evaporation in a high vacuum chamber, may be used to form coatings of magnesium and titanium on a substrate material. Because of the non-equilibrium nature of the vapor deposition process the coatings are single phase solid solutions. The proportions of magnesium and titanium may be independently varied to form a desired mixture of the elements. The duration of the deposition process may be controlled to form coatings having thicknesses from, for example, about 20 nanometers to a millimeter or more depending on the function and required properties of the coating. Essentially any desired solid material may be used as a substrate. The substrate may be suitably cleaned before deposition of the solid solution magnesium-titanium alloy to facilitate suitable adherence of the coating.

In many applications it will be useful to apply the coatings to magnesium or a magnesium alloy, such as a commercial alloy that has been processed, for example, as a cast part, a molded part, or wrought part. The solid solution coatings offer durability and resistance to galvanic corrosion. In such embodiments it may be desirable to form coatings that are rich in magnesium and contain titanium in an amount up to about twenty atomic percent of the two element composition.

Practices of the invention have been illustrated using some preferred embodiments. But these embodiments are not limiting of the scope of the invention.

The invention claimed is:

1. A method of making a solid solution of titanium in magnesium as a film deposited on a magnesium or magnesium alloy substrate, the method comprising:
   separately producing and mixing vapors of magnesium and of titanium in a low pressure chamber and co-depositing magnesium and titanium from the vapor on the substrate, at a substrate temperature of about 25° C., to form a film consisting essentially of a solid solution of titanium in magnesium, the solid solution having a hexagonal close packed crystal structure.

2. A method as recited in claim 1 in which the magnesium vapor and titanium vapor are each produced by electron beam evaporation and the solid solution film has a hexagonal close packed crystal structure.

3. A method as recited in claim 1 in which the solid solution film has a thickness of twenty nanometers or greater.

4. A method as recited in claim 1 in which the film consists essentially of up to about twenty atomic percent titanium.

5. A method as recited in claim 1 in which the thickness of the film is in the range of about twenty nanometers to about one millimeter.

* * * * *